(12) United States Patent
Shigeoka et al.

(10) Patent No.: US 6,479,801 B1
(45) Date of Patent: Nov. 12, 2002

(54) TEMPERATURE MEASURING METHOD, TEMPERATURE CONTROL METHOD AND PROCESSING APPARATUS

(75) Inventors: Takashi Shigeoka; Takeshi Sakuma, both of Kanagawa-Ken (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/691,206

(22) Filed: Oct. 19, 2000

(30) Foreign Application Priority Data

Oct. 22, 1999 (JP) .......................... 11-300826
Jan. 25, 2000 (JP) ........................ 2000-016341

(51) Int. Cl.⁷ ................................ H05B 1/02
(52) U.S. Cl. .................. 219/502; 219/497; 374/121; 392/416
(58) Field of Search ................ 219/497, 502, 219/505, 499, 494; 392/416–418; 374/121–126; 118/724, 725

(56) References Cited

U.S. PATENT DOCUMENTS

| | | | | | |
|---|---|---|---|---|---|
| 5,715,361 A | * | 2/1998 | Moslehi | ...................... | 392/416 |
| 5,938,335 A | * | 8/1999 | Yam | ........................... | 374/124 |
| 6,226,453 B1 | * | 5/2001 | Yam et al. | .................. | 392/418 |
| 6,299,346 B1 | * | 10/2001 | Ish-Shalom | ................. | 374/126 |

* cited by examiner

Primary Examiner—Mark Paschall
(74) Attorney, Agent, or Firm—Smith, Gambrell & Russell, LLP

(57) ABSTRACT

A temperature measuring method measures the temperature of an object of measurement placed in a multiple reflection environment by using a radiation thermometer that uses an effective emissivity $\epsilon_{\mathit{eff}}$ for measurement. The effective emissivity $\epsilon_{\mathit{eff}}$ is calculated by using an expression:

$\epsilon_{\mathit{eff}} = (1-\alpha) \cdot \epsilon + \alpha \cdot \epsilon / \{1 - F \cdot r \cdot (1-\epsilon)\}$ F: View factor ϵ: Emissivity of the object
r: Reflectivity of a reflecting plate included in the radiation thermometer
α: Weighting factor for compensating effects of multiple reflection.

7 Claims, 8 Drawing Sheets

TEMPERATURE MEASURING METHOD, TEMPERATURE CONTROL METHOD AND PROCESSING APPARATUS

BACKGROUND OF THE INVENTION

1. Field of the Invention

The present invention relates to a method of measuring the temperature of a workpiece (object of measurement), such as a semiconductor wafer, and relates to a temperature control method and a processing apparatus.

2. Description of the Related Art

Generally, when fabricating a semiconductor integrated circuit, a semiconductor wafer, such as a silicon wafer, needs to be repeatedly subjected to various processes including film forming processes, annealing processes, oxidation-enhanced diffusion processes, sputtering processes, etching processes and the like. To carry out these processes accurately, the temperature of the semiconductor wafer must be strictly controlled to maintain the semiconductor wafer stably at a desired process temperature.

A general single-wafer processing apparatus has a susceptor having the shape of a disk or a circular cylinder, and a temperature sensor, such as a thermocouple, embedded in the support surface of the susceptor. A temperature of a wafer, placed on the susceptor, is indirectly measured by the temperature sensor. A heater is controlled in a feedback control mode on the basis of measured temperature of the wafer to maintain the wafer at a desired temperature.

It is difficult to measure the actual temperature of the wafer accurately by the above method employing the thermocouple because the temperature of the wafer is lower than that of the susceptor by 10 to 40° C. depending on process pressure.

The temperature of the wafer in process may be measured by bringing a thermocouple into contact with the wafer while the wafer is being processed. However, it is difficult to bring a thermocouple into contact with a wafer being processed. It is scarcely possible to measure the temperature of a wafer by bringing a thermocouple into direct contact with the wafer while the wafer is being processed particularly when the wafer is processed by a processing apparatus in which the wafer is rotated during the process.

Therefore, a radiation thermometer capable of measuring temperatures relatively accurately in a non-contact mode has been used in recent years. The radiation thermometer measures the radiance of a semiconductor wafer, i.e., an object of measurement, to determine the temperature of the wafer from the measured emissivity.

It is known that the emissivity of a semiconductor wafer is considerably dependent on the condition of the surfaces, i.e., the upper and lower surface, of the wafer when the water is subjected to a heat treatment. Therefore, the emissivity of a wafer is dependent on the type of a film formed on the surface of the wafer. Generally, a plurality of types of films are deposited in multiple layers on the surface of a wafer, and a processing apparatus is required to process wafers respectively having different surface conditions. Therefore, when the temperature of the wafer being processed is measured, predetermined thermal emissivities corresponding to the temperature thereof for films of different types are fixedly used and a measured radiance is corrected by calculation.

Generally, the interior of a processing vessel in which the radiation thermometer is installed is an environment in which multiple reflection occurs (hereinafter referred to as "multiple reflection environment"). Therefore, light reflected several times falls on the radiation thermometer in addition to light that falls directly on the radiation thermometer and, consequently, it is difficult to measure the actual temperature of a wafer in such an environment with a sufficiently high accuracy.

Although the performance of the sensing device of the radiation thermometer is scarcely subject to change with time, the performance of lenses included in an optical system that guides light emitted by a workpiece placed in a processing chamber to the radiation thermometer is subject to change with time due to, for example, dimming, which introduces errors in measured temperatures. A method capable of solving such a problem is disclosed in JP-A No. Hei 11-51769. In this prior art method, light emitted by a light source is reflected by a semitransparent mirror toward a lens to project the light through the lens on an object of measurement. Reflected light reflected by the object travels through the lens and the semitransparent mirror to a sensing device. The intensity of the light emitted by the light source and that of the reflected light measured by the sensing device are compared to estimate the degree of change of the performance of the lens with time. When actually measuring the temperature of an object, the intensity of the reflected light measured by the sensing device is corrected according to the change of the performance of the lens to calculate the temperature of the object. This method, however, needs a temperature measuring system provided with a complicated optical system including a semitransparent mirror.

SUMMARY OF THE INVENTION

Accordingly, it is an object of the present invention to provide a temperature measuring method capable of measuring the temperature of an object of measurement (workpiece) with a high accuracy in a multiple reflection environment, and a temperature control method using this temperature measuring method.

A second object of the present invention is to provide a measuring error correcting means of simple construction for correcting measuring errors attributable to a change in the performance of an optical system with time.

A third object of the present invention is to provide a thermal processing apparatus using the temperature measuring method and the measuring error correcting means and capable of high repeatability of process.

The present invention provides a temperature measuring method for measuring a temperature of an object of measurement placed in a multiple reflection environment by using a radiation thermometer. In this method, effective emissivity $\epsilon_{\mathit{eff}}$ is used for calculating the temperature of the object. The effective emissivity $\epsilon_{\mathit{eff}}$ is defined by an expression:

$$\epsilon_{\mathit{eff}}=(1-\alpha)\cdot\epsilon+\alpha\cdot\epsilon/\{1-F\cdot r\cdot(1-\epsilon)\}$$

where F is view factor, $\epsilon$ is the emissivity of the object, r is the reflectivity of a reflecting plate included in the radiation thermometer and $\alpha$ is a weighting factor for compensating effects of multiple reflection.

The present invention also provides a temperature control method and a processing apparatus that use the above method.

The temperature measuring method takes the effect of multiple reflection into consideration by using the weighting factor to measure the true temperature of the object accurately. A heating means included in a processing system is controlled on the basis of the temperature of the object measured on the basis of the foregoing principle of measurement to carry out processes of a high quality in excellent repeatability.

The present invention also provides a processing apparatus, which includes; a processing vessel in which a workpiece is placed; a heating means for heating the workpiece; a light-emitting device that emits light; a radiation thermometer that outputs an signal representing a numerical value corresponding to an radiance of the workpiece; an optical system for guiding light from the light-emitting device to the workpiece and from the workpiece to the radiation thermometer, the optical system including: a first optical fiber having a first end optically connected to the light-emitting device to guide light emitted by the light-emitting device to the workpiece; a second optical fiber having a first end optically connected to the radiation thermometer to guide light from the workpiece to the radiation thermometer; and a lens optically connected to a second end of the first and the second optical fiber; a processor calculating a numerical value representing a condition of the optical system on the basis of an intensity of light emitted by the light-emitting device, guided to the workpiece by the first optical fiber and the lens, reflected by the workpiece and guided by the lens and the second optical fiber to the radiation thermometer, the processor calculating a temperature of the workpiece based on the numerical value corresponding to an radiance of the workpiece and a numerical value representing a condition of the optical system; and a controller that controls the heating means on the basis of the temperature of the object provided by the processor.

DESCRIPTION OF THE PREFERRED EMBODIMENTS

First Embodiment

A first embodiment of the present invention will be described with reference to FIGS. 1 to 5.

Figure 1:
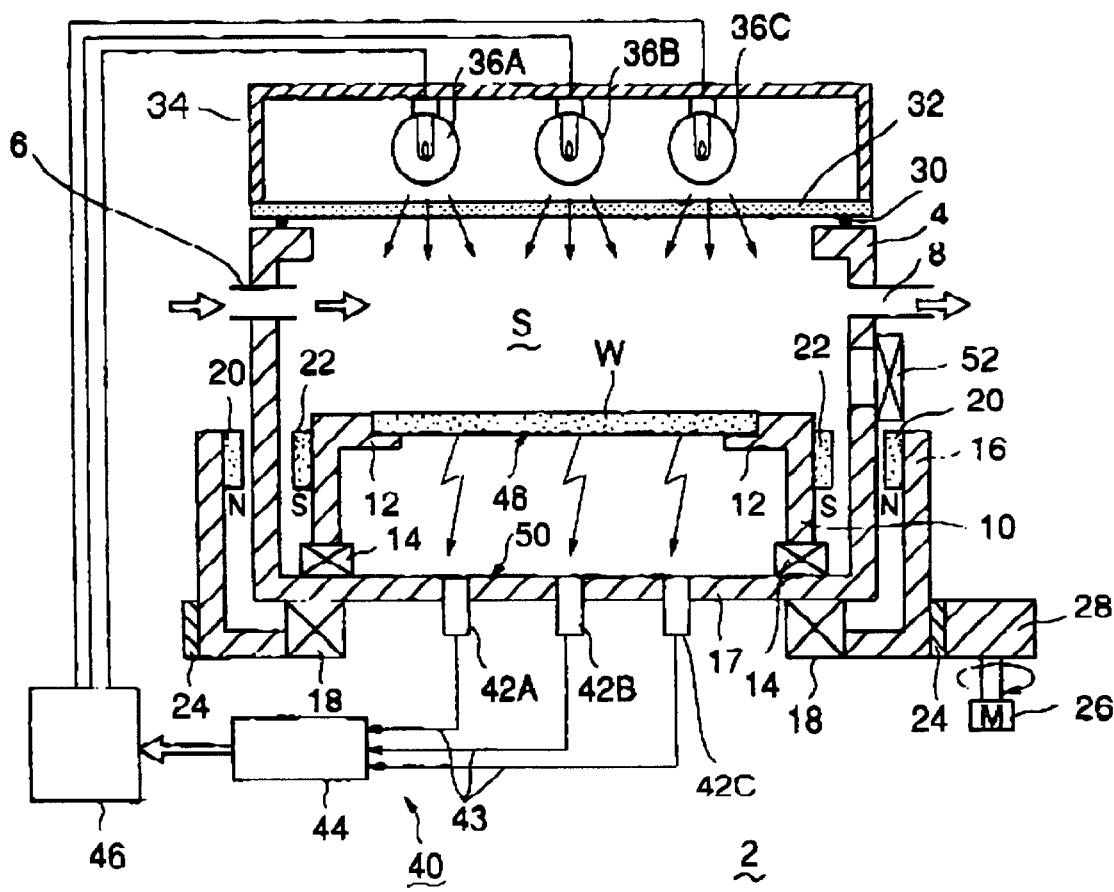
FIG. 1 is a schematic sectional view of a processing apparatus in a first embodiment according to the present invention.

A processing apparatus 2 shown in FIG. 1 has a cylindrical processing vessel 4 of a stainless steel or the like. An inlet port 6 and an exhaust port 8 are formed in upper portions of a side wall of the processing vessel 4. Necessary processing gases are supplied through the inlet port 6 into the processing vessel 4. A vacuum pump, not shown, or the like included in an evacuating system (not shown) is connected to the exhaust port 8 to evacuate the processing vessel 4.

A cylindrical guard ring 10 of SiC (silicon carbide) as a workpiece support is disposed in a lower region of the interior of the processing vessel 4. The guard ring 10 is provided with an inner flange at its upper end. An annular step is formed in the upper surface of the inner flange of the guard ring 10 to form a wafer holding part 12. A peripheral portion of a semiconductor wafer W is seated on the wafer holding part 12.

The guard ring 10 is supported on a bearing 14, such as a thrust bearing, disposed on the bottom wall 17 of the processing vessel 4 so that the guard ring 10 is rotatable relative to the processing vessel 4. A guide ring 16 having an L-shaped cross section is disposed near a lower portion of the processing vessel 4 so as to surround the lower portion of the processing vessel 4 with a gap between the processing vessel 4 and the guide ring 16. The guide ring 16 is connected via a thrust bearing 18 to the bottom wall 17 of the processing vessel 4. The guide ring 16 is rotatable relative to the processing vessel 4. Permanent magnets 20 are attached to the inner surface of an upper portion of the guide ring 16 at angular intervals. Permanent magnets 22 of a polarity opposite that of the permanent magnets 20 are attached to the outer surface of an upper portion of the guard ring 10 at the same angular intervals as the permanent magnets 20. Solenoids may be employed instead of the permanent magnets 20.

The permanent magnets 20 are coupled magnetically with the permanent magnets 22 for magnetic coupling. In this embodiment, the N poles of the permanent magnets 20 and the S poles of the permanent magnets 22 are coupled magnetically. When the guide ring 16 is rotated about the axis of the processing vessel 4, the guard ring 10 is rotated about the axis of the processing vessel 4. A gear 24 is formed on the outer circumference of a lower portion of the guide ring 16. A pinion 28 driven for rotation by a motor 26 is engaged wit the gear 24. Thus, the guide ring 16 can be driven for rotation by the motor 26.

The processing vessel 4 has an open upper end. A transparent quarts plate 32 is joined hermetically to the upper end of the processing vessel 4 with a sealing member 30, such as an O ring, sandwiched between the upper end of the processing vessel 4 and the quartz plate 32. A lamp box 34 is mounted on the quartz plate 32. Three heating lamps 36A, 36B and 36C, i.e., heating means, are contained in the lamp box 34. A semiconductor wafer placed in the processing vessel 4 is heated with heat rays emitted by the heating lamps 36A, 36B and 36C.

A radiation thermometer 40 includes three light receiving elements 42A, 42B and 42C embedded in the bottom wall 17 of the processing vessel 4 with their tips exposed to the interior of the processing vessel 4, and a temperature measuring unit 44 connected to the light receiving elements 42A, 42B and 42C by optical fibers 43. The light receiving elements 42A, 42B and 42C are transparent, cylindrical quartz rods that transmit light or heat rays emitted from the back surface 48 of the wafer W. The heat rays are transmitted by the optical fibers 43 to the temperature measuring unit 44. The temperature measuring unit 44 determines the true temperature of the wafer W on the basis of he intensity of the light or heat rays transmitted thereto. Connected to the temperature measuring unit 44 is a temperature controller 46 that controls the respective temperatures of the heating lamps 36A to 36C in a feedback control mode on the basis of the true temperature of the wafer W.

The heating lamps 36A to 36C are assigned to a plurality of zones in the surface of the wafer W and can be individually controlled. The back surface 48 of the wafer W and the inner surface 50 of the bottom wall 17 of the processing vessel 4 are reflecting surfaces respectively having certain reflectivities. Thus, the back surface 48 of the wafer W and the inner surface 50 of the bottom wall 17 creates a multiple reflection environment.

The processing vessel 4 is provided in its side wall with a gate valve 52 through which a semiconductor wafer W is carried into and carried out of the processing vessel 4. Lifter pins, not shown, that are moved vertically when a semiconductor wafer W is carried into and carried out of the processing vessel 4 are placed on the bottom wall 17.

The operation of the processing apparatus will be described hereinafter. A semiconductor wafer W is carried from a load lock chamber, not shown, into the evacuated processing vessel 4 through the open gate valve 52. The not shown lifter pins are moved vertically to place the wafer W on the upper end of the holding part 12 of the guard ring 10.

After the wafer W has been placed on the guard ring 10, the gate valve 52 is closed. The processing vessel 4 is evacuated and processing gases necessary for carrying out a desired process are supplied through the inlet port 6 into the processing vessel 4. The interior of the processing vessel 4 is maintained at a predetermined process pressure. For example, when the desired process is a film forming process, a deposition gas as the processing gas and a carrier gas, such as $N_2$ gas, are supplied into the processing chamber S defined by the processing vessel 4.

Then, the motor 26 is actuated to start driving the guide ring 16 surrounding a lower portion of the processing vessel 4 for rotation. Since the permanent magnets 20 of the guide ring 16 are magnetically coupled with the permanent magnets 22 attached to the guard ring 10 placed in the processing vessel 4, the guard ring 10 supporting the wafer W starts rotating together with the guide ring 16. The wafer W is rotated continuously during the process.

Simultaneously with starting of rotation of the wafer, the temperature controller 46 turns on the heating lamps 36A to 36C contained in the lamp box 34 put on top of the processing vessel 4. Heat rays emitted by the heating lamps 36A to 36C travel through the quartz plate 32 into the processing chamber S and fall on the upper surface of the semiconductor wafer W to heat the wafer to and maintain the same at a predetermined temperature.

Operations for controlling the temperature of the wafer W will be described. Lights, such as heat rays, fall on the light receiving elements 42A to 42C, i.e., quartz rods, embedded in the bottom wall 17 of the processing vessel 4 and are transmitted by the optical fibers 43 to the temperature measuring unit 44. The temperature measuring unit 44 calculates the temperature of each measuring point of the wafer W by using the intensities of the received lights and the effective emissivity $\epsilon_{eff}$, which will be explained later. The calculated temperature is accurate and very close to the true temperature of the wafer W. The temperature controller 46 controls the values of electric power supplied to the heating lamps 36A to 36C individually on the basis of the calculated temperatures. Since the back surface 48 of the wafer W and the inner surface 50 of the bottom wall 17 are virtually mirror-finished surfaces, a multiple reflection environment is created under the wafer W. Therefore heat rays reflected a plurality of times by the back surface 48 of the wafer W and the inner surface 50 of the bottom wall 17, i.e., disturbing heat rays, fall on the light receiving elements 42A to 42C in addition to heat rays which travel from the back surface 48 of the wafer W directly to the light receiving elements 42A to 42C. Since the effective emissivity $\epsilon_{eff}$ used in the method of the present invention is determined by dynamically taking the effect of the multiple reflection heat rays into consideration, the calculated temperature is very close to the true temperature of the wafer W. Accordingly, the wafer W can be accurately maintained at a desired temperature.

Figure 2:
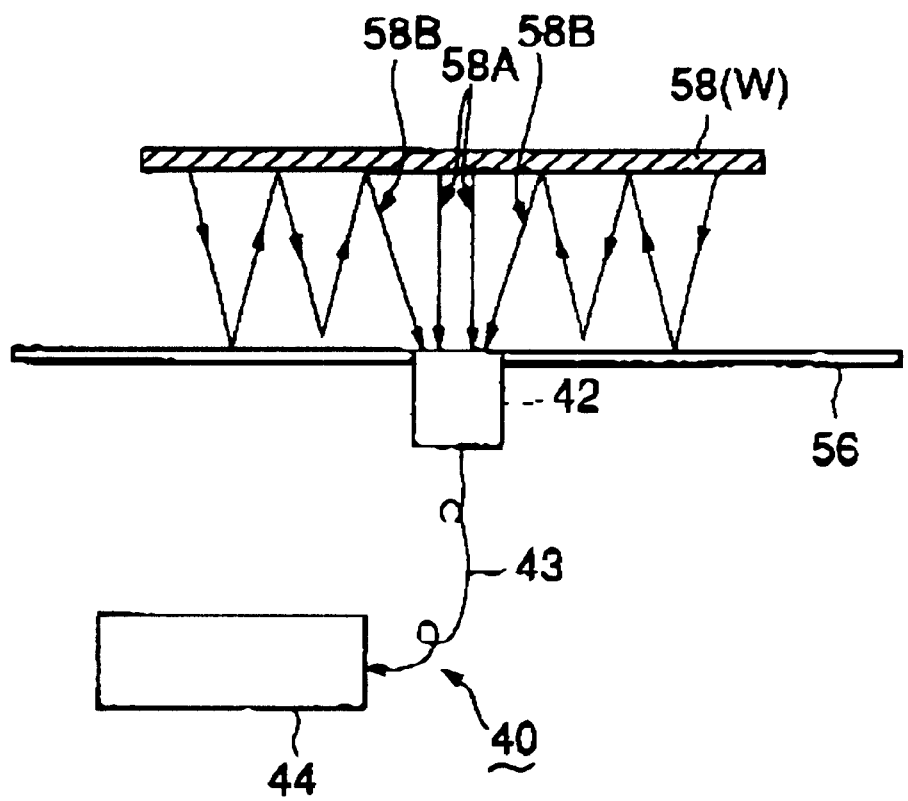
FIG. 2 is a diagrammatic view of assistance in explaining a model of a multiple reflection environment.

The effective emissivity $\epsilon_{eff}$ used in the method of the present invention will be explained with reference to a multiple reflection environment model shown in FIG. 2. An object 54 of measurement shown in FIG. 2 has the shape of a flat plate and corresponds to the semiconductor wafer W shown in FIG. 1. The temperature of the object 54 is measured by a radiation thermometer 40 having a light receiving element 42 and a temperature measuring unit 44. A reflecting plate 56 is arranged in parallel to the object 54 on the level of a light receiving surface of the light receiving element 42. The light receiving surface of the light receiving element 42 is surrounded by the reflecting plate.

A multiple reflection environment is created between the lower surface of the object 54 and the upper surface of the reflecting plate 56. Light rays 58b reflected a plurality of times in the multiple reflection environment fall on the light receiving elements 42 in addition to light rays 58A which travel from the object 54 directly to the light receiving element 42.

As generally known, the radiance E of an object is dependent on the emissivity $\epsilon$ of the object and the temperature T (absolute temperature) of the object and is expressed by:

$$E = \epsilon \cdot f(T) \tag{1}$$

where f(T) is the radiance of a blackbody expressed in a function of temperature T, such as Planck radiation formula or a formula specified in JIS 1610.

The present invention uses an effective emissivity $\epsilon_{eff}$ defined by the following expression instead of emissivity $\epsilon$ in Expression (1).

$$\epsilon_{eff} = (1-\alpha) \cdot \epsilon + \alpha \cdot \epsilon / \{1 - F \cdot r \cdot (1-\epsilon)\} \tag{2}$$

where:

F: View factor $\epsilon$: Emissivity of the object 54 (Back surface 48 of the semiconductor wafer)

r: Reflectivity of the reflecting plate 56 (Inner surface 50 of the bottom wall 17)

α: Weighting factor indicating effects of multiple reflection

Figure 3:
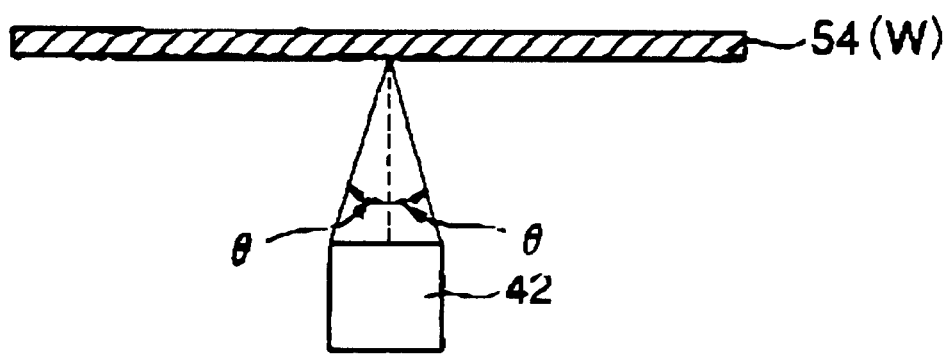
FIG. 3 is a diagrammatic view of assistance in explaining view factor.

The view factor F is defined by:

$$F = (1 + \cos 2\theta)/2 \tag{3}$$

where θ is an angle equal to half of the angle between lines connecting the opposite ends of a diameter of the light receiving surface of the light receiving element 42 and a point of intersection of a perpendicular at midpoint of the diameter of the light receiving surface and the lower surface of the object 54 (see FIG. 3).

The weighting factor α indicates the ratio of the intensity of light received by the light receiving element 42 after multiple reflection and introduced into the temperature measuring unit 44 to the total intensity of the light ("the total intensity of the light" means the sum of the intensity of the light received by the element 42 after multiple reflection and introduced to the unit 44 and the light that travels from the object 54 directly to the element 42 and is received by the element 42 and is introduced into temperature measuring unit 44). The value of the weighting factor α is in the range of 0 to 1. The value of the weighting factor α is large when the upper surface of the reflecting plate 56 has a large area and is small when the upper surface of the reflecting plate 56 has a small area. The value of the weighting factor α is dependent on the characteristics of the processing apparatus and the numerical aperture NA of the light receiving element 42.

A temperature very close to the true temperature of the object 54 can be calculated by using the effective emissivity $\epsilon_{eff}$. The light receiving element 42 corresponds to the light receiving elements 42A to 42C shown in FIG. 1. The respective temperature of zones of the wafer W respectively corresponding to the light receiving elements 42A to 42C can be accurately measured.

Values of the emissivity ϵ for films of different types to be formed on the back surfaces of wafers W placed in the processing vessel 4 may be stored in the temperature measuring unit 44 beforehand and may be sequentially used as the process progresses or may be sequentially entered by operating an external input device.

Results of simulation of the temperature measuring method according to the present invention using a radiation thermometer will be described hereinafter.

Figure 4:
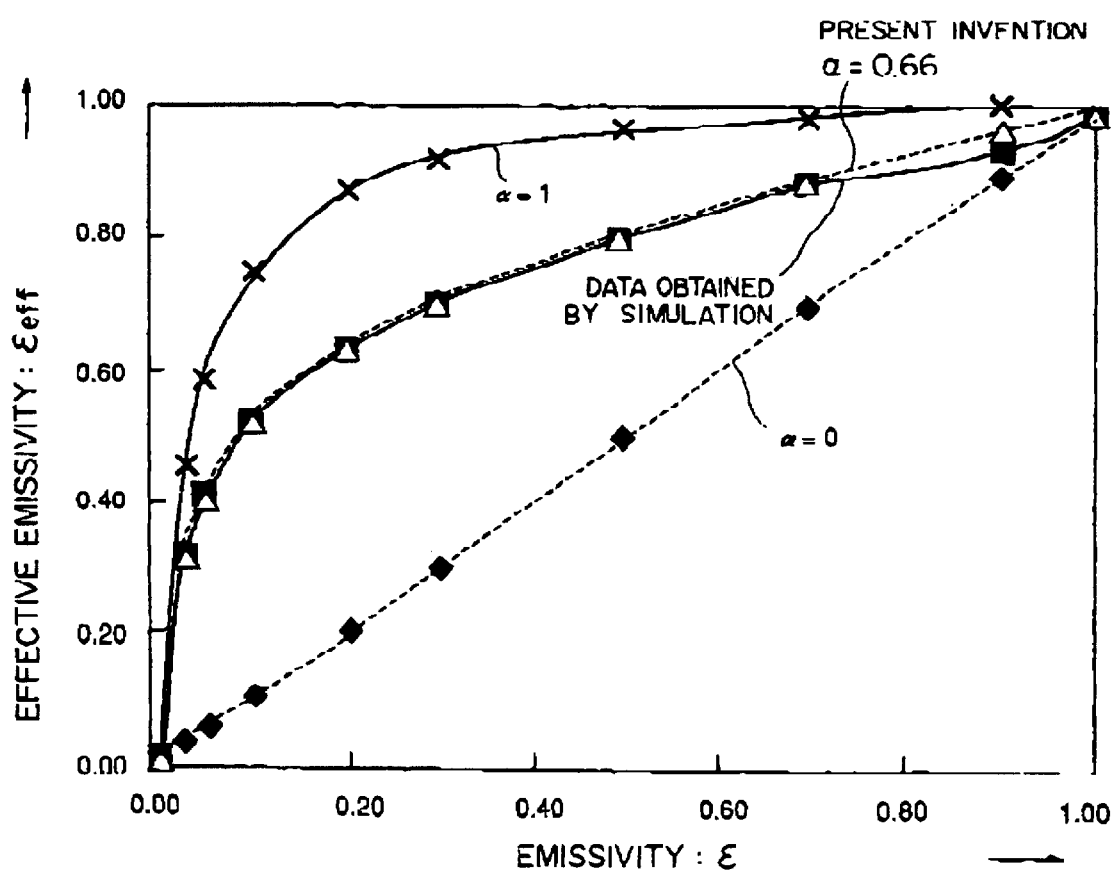
FIG. 4 is a graph showing the relation between the emissivity $\epsilon$ of a workpiece (object of measurement) and effective emissivity $\epsilon_{eff}$.

FIG. 4 is a graph showing the relation between the emissivity ϵ of a workpiece (object of measurement) and effective emissivity $\epsilon_{eff}$, in which F=0.96, r=0.9 and α=0.66 (NA=0.2) for the temperature measuring method of the present invention, α–1 for Comparative example 1, and α–0 for Comparative example 2 (Expression (2)).

As obvious from FIG. 4, the effective emissivities of Comparative example 1 (α=1) and Comparative example 2 (α=0) differ greatly from the effective emissivity determined by simulation. The effective emissivity of the present invention (α=0.66) agree with the result of simulation with a high accuracy.

Figure 5:
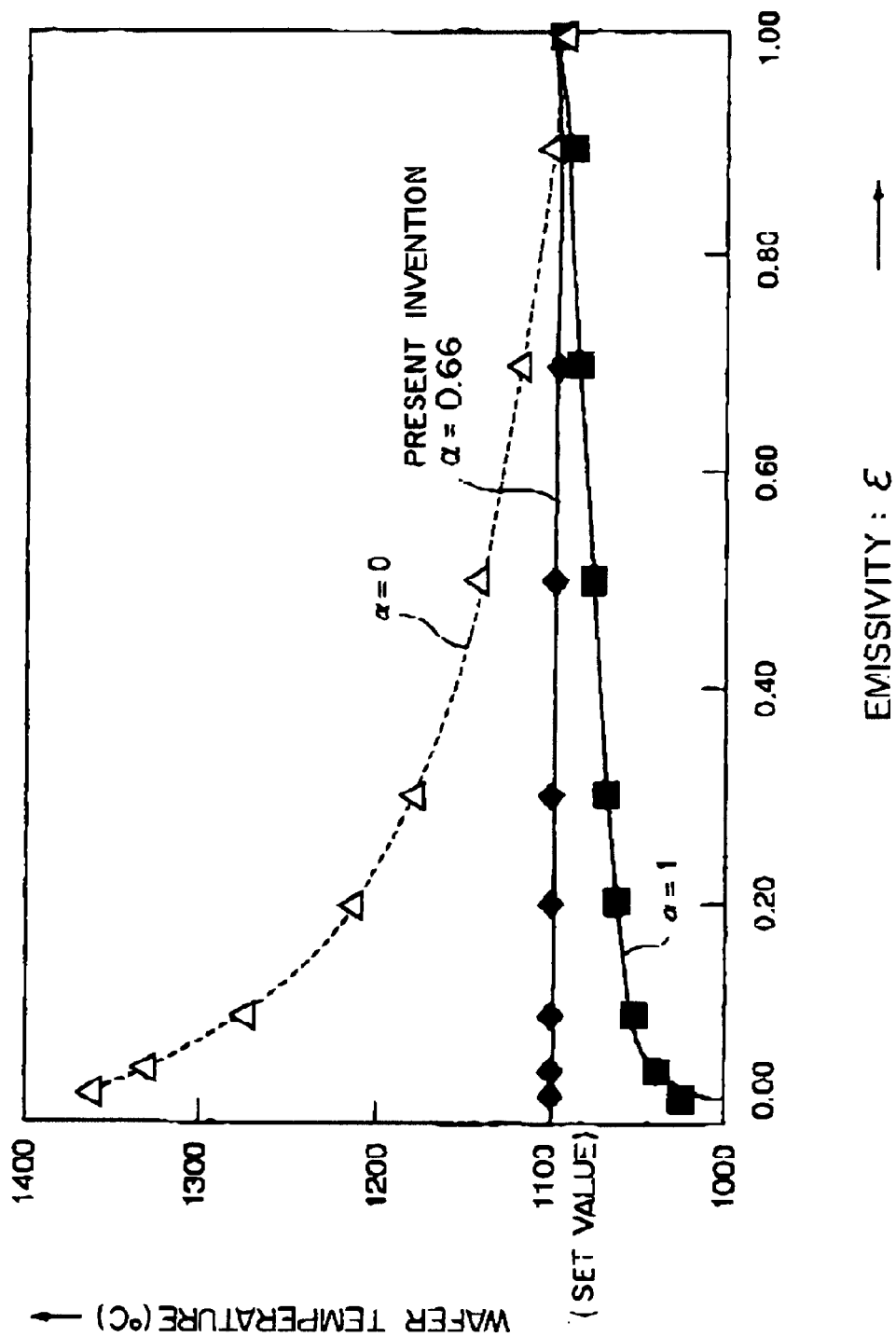
FIG. 5 is a graph showing the relation between the weighting factor and accuracy of temperature control.

FIG. 5 is a graph showing the relation between the weighting factor and accuracy of temperature control. A set temperature of the wafer is 1100° C. As obvious from FIG. 5, the temperature determined by Comparative example 1 (α=1) is far lower than the set temperature of 1100 by more than 100° C. when the emissivity ϵ is small and the difference between the set temperature and the temperature determined by Comparative example 1 decreases with the increase of the emissivity ϵ.

The temperature determined by Comparative example 2 (α=0) is far higher than the set temperature of 1100 by more than 200° C. when the emissivity ϵ is small and the difference between the set temperature and the temperature determined by Comparative example 21 decreases sharply with the increase of the emissivity ϵ, which is undesirable. Thus, the differences between the temperatures determined by Comparative examples 1 and 2, and the set temperature are large when the emissivity ϵ is small, which is undesirable.

The temperature determined by the temperature measuring method of the present invention remains substantially at the set temperature of 1100° C. regardless of the value of the emissivity ϵ, which proved that the temperature measuring method of the present invention is capable of measuring the temperature of the wafer with a high accuracy.

The processing apparatus shown in FIG. 1 is provided with the three heating lamps 36A to 36C. A practical processing apparatus is provided with many heating lamps so as to correspond to many heating zones and many light receiving elements respectively corresponding to the heating zones. The number of the light receiving elements is at least equal to that of the heating zones.

Although values of the emissivity ϵ for films of different types to be formed on the back surfaces of wafers W placed in the processing vessel 4 are stored in the temperature measuring unit 44 beforehand and the values are sequentially used as the process progresses in the foregoing embodiment, the emissivity ϵ of the back surface 48 of the wafer W may be measured in a real-time measuring mode and the measured emissivity ϵ may be given to the temperature measuring unit 44.

Figure 6:
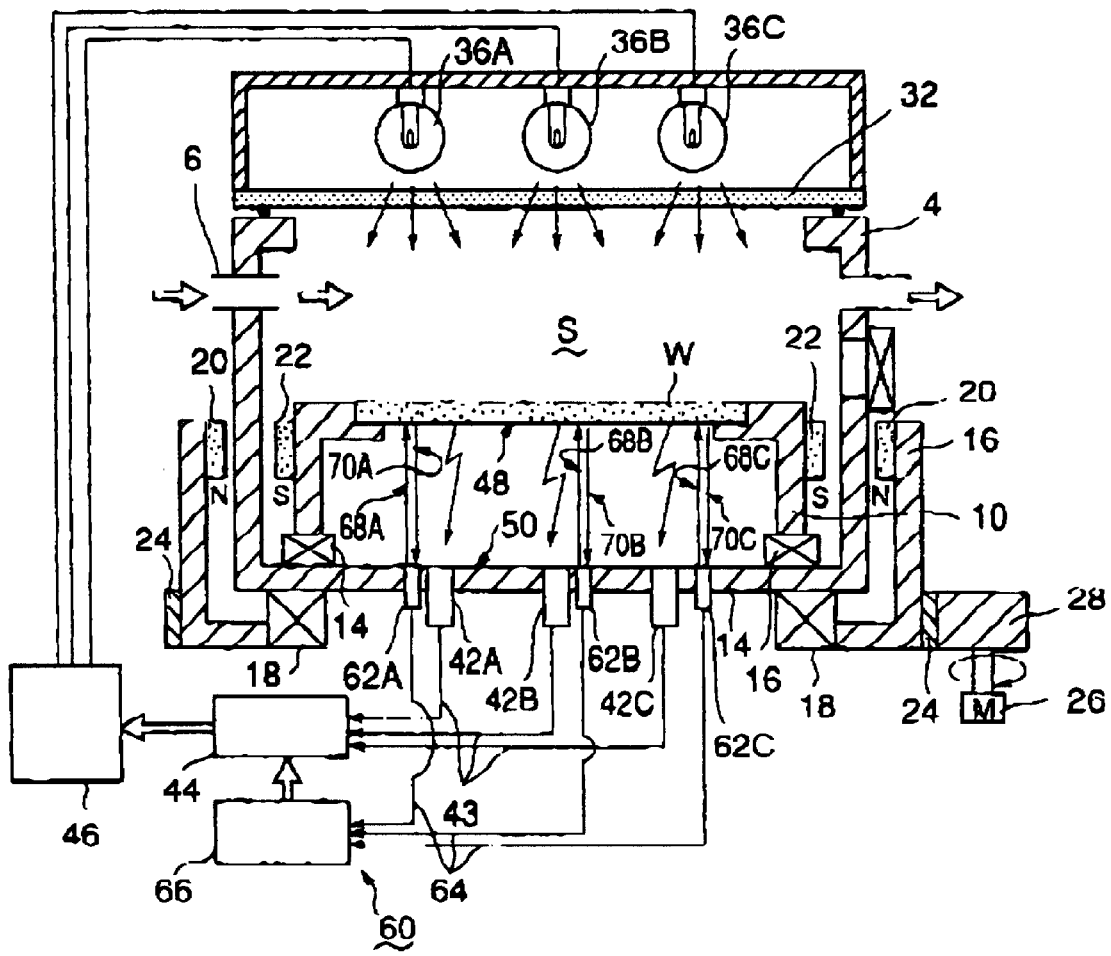
FIG. 6 is a schematic sectional view of a processing apparatus in a modification of the processing apparatus shown in FIG. 1.

A processing apparatus in a modification of the processing apparatus shown in FIG. 1 is shown in a schematic sectional view in FIG. 6, in which parts like or corresponding to those shown in FIG. 1 are denoted by the same reference characters and the description thereof will be omitted. Referring to FIG. 6, an emissivity measuring device 60 is combined with the bottom wall 17 of the processing vessel 4. The emissivity measuring device 60 has photoelectric devices 62A, 62B and 62C each having a light-emitting device and a photodetector, and an emissivity measuring unit 66. The photoelectric devices 62A to 62C are embedded in portions of the bottom wall 17 adjacent to the light receiving elements 42A to 42C. Output signals, representing the intensities of the reflected light beams, provided by the photodetectors of the photoelectric devices 62A to 62C are transmitted by wires 64 to the emissivity measuring unit 66. The photoelectric devices 62A to 62C emit illuminating light beams 68A, 68B and 68C of a predetermined wavelength toward the back surface 48 of the wafer W, and receive reflected light beams 70A, 70B and 70C, respectively. The reflectivities r of the portions of the back surface 48 of the wafer W corresponding to the photoelectric devices 62A to 62C are known from the ratios between the intensities of the illuminating light beams 68A to 68C and those of the reflected light beams 70A to 70C respectively corresponding to the illuminating light beams 68A to 68C. Emissivity ϵ is equal to 1 minus reflectivity r, i.e., ϵ=1−r. The emissivity ϵ is given to the temperature measuring unit 44, and the effective emissivity $\epsilon_{eff}$ is calculated on the basis of the emissivity ϵ by using Expression (2).

Thus, emissivities for films of different types do not need to be stored beforehand, the emissivity is measured in a real-time mode and the emissivity thus determined is used for the temperature control of the wafer W.

Figure 7:
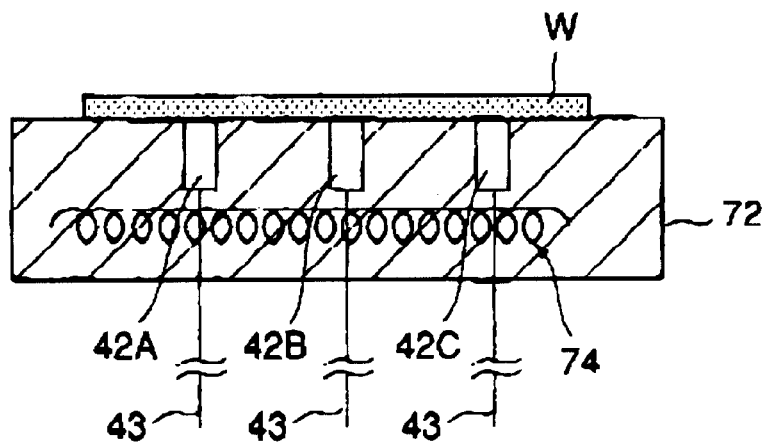
FIG. 7 is a schematic sectional view of a susceptor provided with a resistance heater.

Although the processing apparatus shown in FIGS. 1 and 6 employ the heating lamps 36A to 36C as heating means, resistance heaters may be used instead of the heating lamps 36A to 36C. FIG. 7 shows susceptor 72 provided with a plurality of resistance heaters 74 embedded therein as a heating means for heating a wafer W. The susceptor 72 is formed of aluminum nitride or the line in a cylindrical shape. The support surface of the susceptor 72 are divided into a plurality of concentric zones and the plurality of resistance heaters 74 are assigned to the plurality of concentric zones, respectively. Levels of electric power supplied to the resistance heaters 74 can be individually controlled. Light receiving elements 42A, 42B and 42C are embedded in the upper surface of the susceptor 72 with their upper ends exposed to a processing chamber defined by a processing vessel 4.

If a processing apparatus does not need to rotate the wafer W during the process, a processing gas supply unit formed of, for example, transparent quartz that transmits heat rays and resembling a shower head may be put on top of a processing vessel instead of forming a side-flow processing gas supply structure.

When the susceptor 72 is provided with the resistance heaters 74 as shown in FIG. 7, the shower head may be an ordinary shower head structure formed of, for example, aluminum.

The method and apparatus according to the present invention is applicable not only to film forming process but also to annealing processes, sputtering processes, etching processes and the like that heats workpieces for processing.

The workpiece is not limited to a semiconductor wafer, but the same may be an LCD substrate, a glass substrate or the like.

Second Embodiment

A second embodiment of the present invention will be described with reference to FIGS. 8 to 11.

Figure 8:
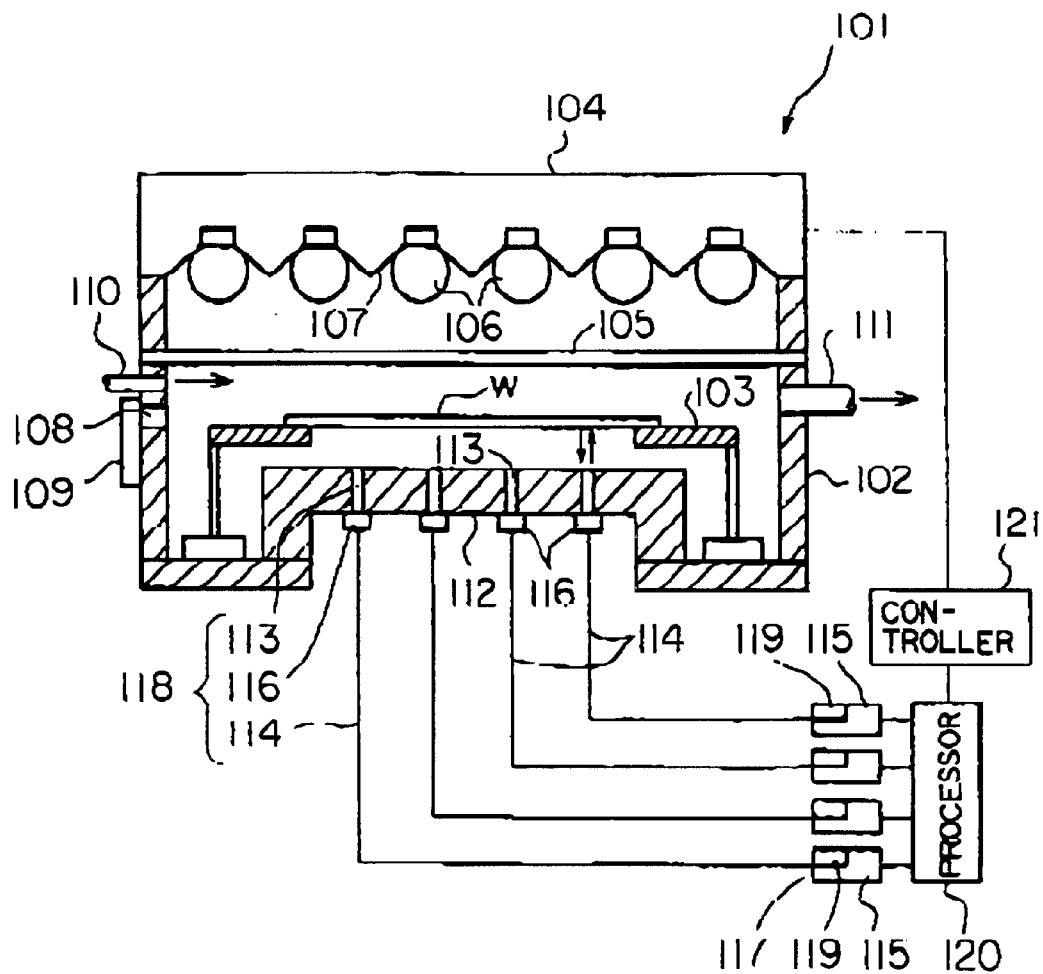
FIG. 8 is a schematic sectional view of a processing apparatus in a second embodiment according to the present invention.

FIG. 8 shows a single-wafer processing apparatus 101 that processes semiconductor wafers one at a time. The processing apparatus has an airtight processing vessel 102 formed of aluminum. A cylindrical guard ring 103, i.e., a support, is installed in the processing vessel 102 to support a semiconductor wafer W by its peripheral portion in a horizontal position. The guard ring 103, similarly to the guard ring 10 of the processing apparatus shown in FIG. 1, may be rotatable.

A quarts plate 105 is attached to an upper portion of the processing vessel 102 and a heating unit 104 for heating a semiconductor wafer W supported on the guard ring 103 is mounted on the processing vessel 102. The heating unit 104 includes, as a principal components, a plurality of heating lamps 106 capable of being controlled for quick temperature rise and quick temperature drop, such as halogen lamps and a reflector 107 for reflecting heat rays emitted by the heating lamps 106 effectively toward a wafer W supported on the guard ring 103.

The processing vessel 102 has a side wall provided with an opening 108 through which a semiconductor wafer W is carried into and carried out of the processing vessel 102. Normally, the opening 108 is closed hermetically by a gate valve 109. A load lock vessel, not shown, provided with a carrying mechanism is connected to the gate valve 109. The carrying mechanism carries a wafer W into and carries out the same from the processing vessel 102. An inlet port 110 and an exhaust port 111 are formed in upper portions of the side wall of the processing vessel 102. Necessary processing gases and an inert gas, such as N2 gas, are supplied through the inlet port 110 into the processing vessel 102. An exhaust system including a reduced pressure control device provided with a vacuum pump capable of evacuating the processing vessel 102 is connected to the exhaust port 111. The exhaust system is connected, for example to an industrial exhaust system.

A bottom wall 112 of the processing vessel 102 is provided with a plurality of openings and a plurality of quartz rods 112 or lenses are fitted hermetically in those openings so as to face the back surface (lower surface) of a semiconductor wafer W supported on the guard ring 102. The quartz rods 112 are connected to radiation thermometers 115 by optical-fiber cables 114, respectively. Each of the radiation thermometers 115 is provided with a built-in infrared sensor or a photodetector (not shown) outputs an electrical signal corresponding to the intensity of the light that is received by the quartz rod 112 and reaches the infrared sensor via the optical-fiber cables 112.

The quartz rods 112 and the optical-fiber cables 112 are connected by optical connectors 116, respectively. The radiation thermometers 115 are provided with light-emitting diodes 119 (LEDs) or light-emitting devices, respectively.

Figure 9:
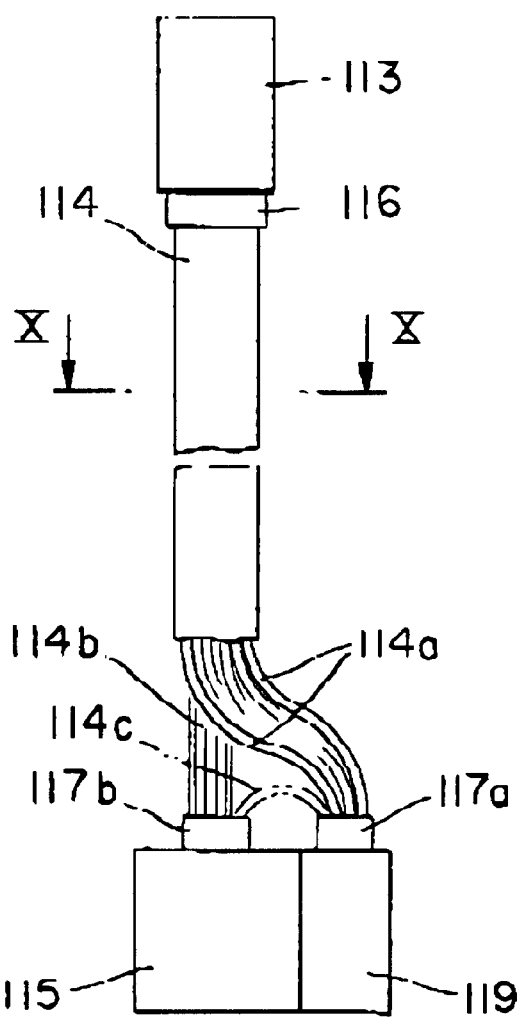
FIG. 9 is a schematic view of an optical system for temperature measurement included in the processing apparatus shown in FIG. 8.
Figure 10:
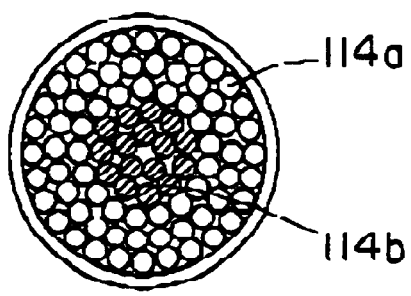
FIG. 10 is a schematic sectional view of an optical fiber cable shown in FIG. 9.

Referring to FIGS. 9 and 10, the optical-fiber cable 112 has first optical fibers 114a and second optical fibers 114b surrounded by the first optical fibers 114a. The first optical fibers 114a are optically connected to the light-emitting diode 119 by an optical connector 117a. The second optical fibers 114b are optically connected to the radiation thermometer 115 by an optical connector 117b.

Radiation emitted by the semiconductor wafer W or reflected light reflected by the semiconductor wafer W is received by the quartz rod 113 transmitted by the optical-fiber cable 114. Part of the radiation or the reflected light is transmitted to the radiation thermometer 115 by the second optical fibers 114b. Light emitted by the light-emitting diode 119 is transmitted by the second optical fibers 114b of the optical-fiber cable 112 and is projected through the quartz rod 113 onto the semiconductor wafer W. The first optical fibers 114a are used to receive light and the second optical fibers 114b are used to project light. Thus, a simple optical system 118 can be constructed without using any semitransparent mirrors.

The processing apparatus 101 has a processor 120 that calculates the temperatures of sections of the semiconductor wafer W on the basis of the output signals provided by the infrared sensor of the radiation thermometers 115, and a controller 121 that controls the heating unit 104 on the basis of the calculated temperatures of the sections of the semiconductor wafer W calculated by the processor 120. A temperature control program for heat treatment is stored in the controller 121. The controller 121 controls the heating unit 104 in a feedback control mode according to the temperature control program on the basis of the temperatures of the sections of the semiconductor wafer W calculated by the processor 120.

The operation of the processing apparatus 101 will be described hereinafter.

Figure 11:
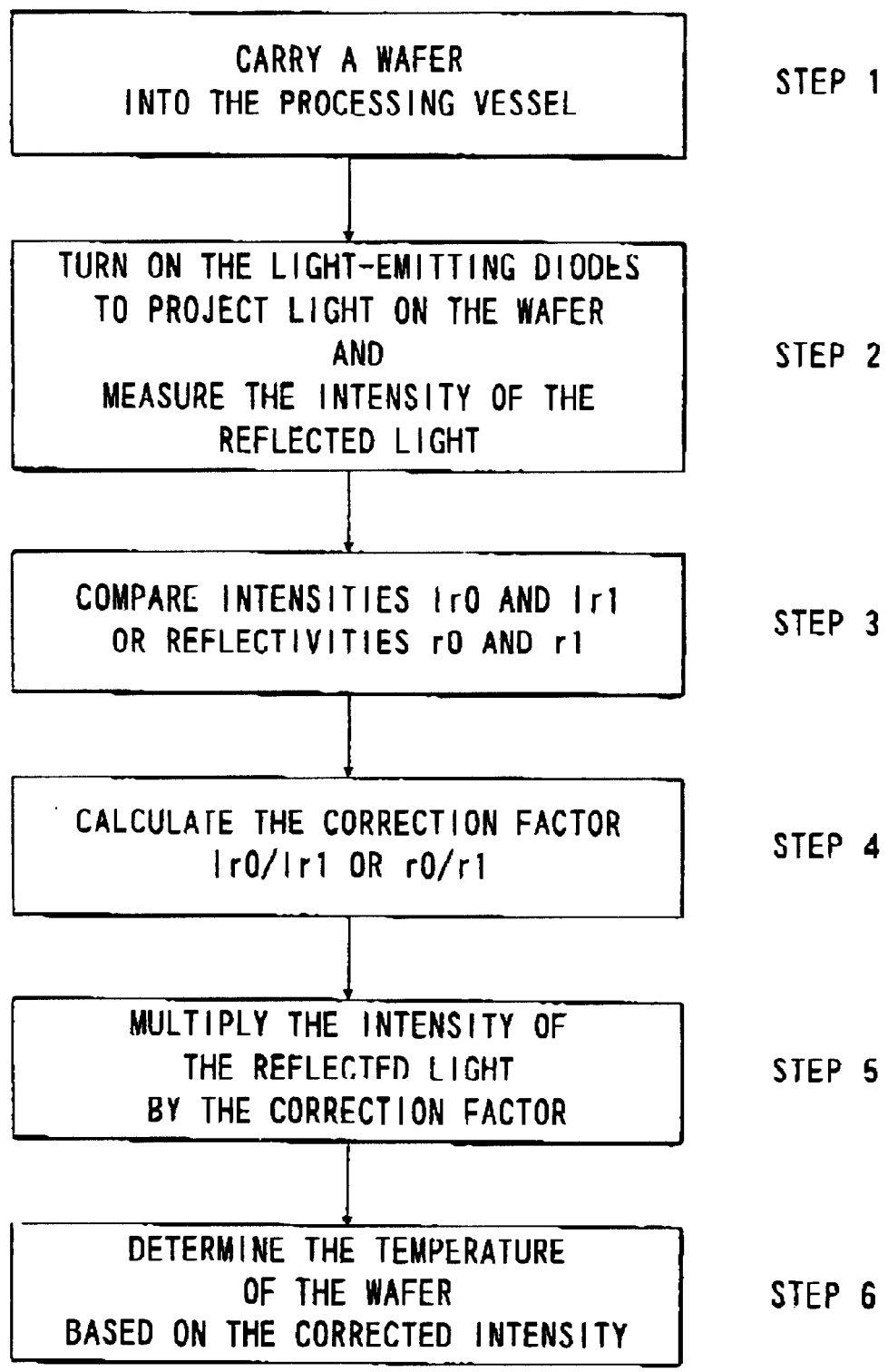
FIG. 11 is a flow chart of a procedure for calibrating a radiation thermometer.

A method of correcting the radiation thermometer 115 will be described with reference to a flow chart shown in FIG. 11. A semiconductor wafer W is carried into the processing vessel 102 and is mounted on the guard ring 103 by the carrying mechanism installed in the load local chamber, not shown, in step S1.

In step S2, the light-emitting diodes 119 are turned on to project light through the first optical fibers 114a and the quartz rods 113 onto sections of the semiconductor wafer W corresponding to the quartz rods 113. The light is reflected by the sections of the back surface of the semiconductor wafer W. The reflected light is guided by the quartz rods 113 and the second optical fibers 114b to the infrared sensor of the radiation thermometers 115. The intensity $I_{r1}$ of the reflected light reflected by each of the sections of the back surface of the semiconductor wafer is measured by the processor 120.

In step S3, the intensity $I_{r1}$ of the reflected light is compared with a reference intensity $I_{r0}$, i.e., the intensity of reflected light measured by the same procedure as the intensity $E_{r1}$ when the processing apparatus 101 is new or immediately after the completion of the overhaul of the processing apparatus 101. If $I_{r0}=I_{r1}$, it is considered that any substantial change with age, such as dimming, has not been made in the optical system 118 (particularly, in the quartz rod 113) and correction is not made. If $T_{r0}$ at $T_{r1}$, the ratio $I_{r0}/I_{r1}$ is calculated in step S4. The ratio $I_{r0}/I_{r1}$ is used as a correction factor.

When actually subjecting a semiconductor wafer W to a heat treatment process, the intensity of the reflected light introduced into each radiation thermometer 115 is multiplied by the correction factor $I_{r0}/I_{r1}$ in step S5.

The processor 120 calculates the radiance of each section of the wafer W based on the corrected intensity, and calculates the temperature of each section of the wafer W based on each of the calculated radiance, in step 6.

Step S3 for comparing the measured intensity of the reflected light with the reference intensity may be omitted and step S1 for calculating the correction factor $I_{r0}/I_{r1}$ may be executed subsequently to step S2.

The processor 120 executes operations for determining the intensity of the reflected light, the calculation of the correction factor $I_{r0}/I_{r1}$, and the multiplication of the measured intensity by the correction factor $I_{r0}/I_{r1}$. If the semiconductor wafer W is heated during the measurement of the reflected light to obtain data for correction, information about radiation emitted by the semiconductor wafer W is added to information about the reflected light. Therefore it is preferably to measure the reflected light for correction in an environment of an ordinary temperature to expect an improved measuring accuracy. It is preferable that a semiconductor wafer for reflected light measurement is different from semiconductor wafers to be subjected to a heat treatment process. It is desirable to use the same semiconductor wafer or semiconductor wafers of the same characteristics for reflected light measurement to determine the reference intensity and for reflected light measurement to determine the present condition of the optical system.

If the aging deterioration of the light-emitting diodes 119 must be taken into consideration, the radiances $I_i$ of the light-emitting diodes 119 may be directly measured by the radiation thermometer 115 when measuring the intensity of reflected light. When measuring light emitted by the light-emitting diode 119, the light-emitting diode 119 may be connected to the corresponding radiation thermometer 115 by, for example, an optical fiber 114c as shown in FIG. 9. The ratio $r_0/r_1$, where $R_0 = I_{r0}/I_i$ is a reference reflectivity determined beforehand and $r_1 = I_{r1}/T_i$ is a measured reflectivity, may be used as a correction factor.

When actually subjecting a semiconductor wafer W to a heat treatment process, the semiconductor wafer W for reflection measurement is taken out of the processing vessel 102 by the carrying mechanism and a semiconductor wafer W to be processed is carried into the processing vessel 102. The atmosphere in the processing vessel 102 is replaced beforehand by an inert gas. Subsequently, processing gases are supplied through the inlet port 110 into the processing vessel 102, and the reduced pressure control mechanism of the exhaust system maintains the interior of the processing vessel 102 at a predetermined reduced pressure, the heating lamps 106 of the heating unit 104 are turned on to heat the semiconductor wafer W quickly to a predetermined temperature, and a desired heat treatment process is started.

Radiation emitted by the heated semiconductor wafer W is transmitted by the optical system 118 to the radiation thermometers 115. The processor 120 calculates the temperature of the sections of the wafer W according to the steps shown in FIG. 11. The controller 121 and gives the calculated temperatures to the controller 121. The controller 121 controls the heating lamps 106 of the heating unit 104 according to the control program in a feedback control mode on the basis of the calculated temperatures.

Upon the completion of the desired heat treatment process, the hating lamps 106 of the heating unit 104 are turned off, the supply of the processing gases is stopped, the atmosphere in the processing chamber 102 is replaced by an inert gas, and then the semiconductor wafer W is carried out of the processing vessel 102.

Thus errors in temperatures measured by the radiation thermometers 115 due to the aging change of the characteristic of the optical system 118 can be easily corrected and the temperature of the semiconductor wafer W can be accurately controlled for a heat treatment process, which improves the processing ability of the processing apparatus.

The workpieces are not limited to semiconductor wafers and may be glass substrates, LCD substrates or such. Laser diodes or lamps may be used instead of the light-emitting diodes.

What is claimed is:

1. A method of measuring temperature of an object of measurement placed in a multiple reflection environment by using a radiation thermometer, said method comprising the steps of:

measuring a numerical value of a parameter that changes corresponding to a change in a radiance E of the object; and calculating a temperature of the object based on the numerical value of the parameter by using a formula indicating a relationship between the parameter, and effective emissivity $\epsilon_{eff}$ of the object and a radiance of a blackbody f(T) that is expressed in a function of temperature T of the object, wherein the effective emissivity $\epsilon_{eff}$ is defined by the following expression:

$$\epsilon_{eff} = (1-\alpha)\cdot\epsilon + \alpha\cdot\epsilon/\{1 - F\cdot r(1-\epsilon)\}$$

where F is a view factor, $\epsilon$ is an emissivity of the object, r is a reflectivity of a reflecting plate opposing to the object and $\alpha$ is a weighting factor indicating effects of multiple reflection.

2. The method according to claim 1, wherein the measuring step includes the steps of:

receiving a light by a light receiving element facing the multiple reflection environment; and introducing the light into the radiation thermometer;

wherein the parameter is an intensity of the light introduced into the radiation thermometer.

3. A temperature control method comprising the steps of:

measuring temperature of a workpiece supported on a supporting member in a processing vessel and heated at a predetermined temperature by a heating means for a predetermined heat treatment process by a radiation thermometer; and controlling the heating means in a feedback control mode based on the temperature of the workpiece measured in the measuring step;

wherein the step of measuring temperature of the workpiece including the steps of:

measuring a numerical value of a parameter that is a radiance E of the object or that can be expressed in a function of the radiance E; and calculating a temperature of the object based on the numerical value of the parameter by using a formula including the parameter, and effective emissivity $\epsilon_{eff}$ of the object and a radiance of a blackbody f(T) that is expressed in a function of temperature T of the object, wherein the effective emissivity $\epsilon_{eff}$ is defined by the following expression:

$$\epsilon_{eff} = (1-\alpha)\cdot\epsilon + \alpha\cdot\epsilon/\{1 - F\cdot r(1-\epsilon)\}$$

where F is a view factor, $\epsilon$ is an emissivity of the object, r is a reflectivity of a reflecting plate opposing to the object and $\alpha$ is a weighting factor indicating effects of multiple reflection.

4. A processing apparatus for subjecting a workpiece to a designated heat treatment process, said processing apparatus comprising:

a processing vessel in which the workpiece is processed;

a workpiece supporting device for supporting the workpiece;

a heating means for heating the workpiece;

a radiation thermometer capable of noncontact measurement of temperature of the workpiece, the thermometer capable of executing the method according to claim 1; and a temperature controller that controls the heating means on the basis of the temperature of the workpiece measured by the radiation thermometer.

5. The processing apparatus according to claim 4, wherein the workpiece supporting device is capable of turning the workpiece supported thereon.

6. The processing apparatus according to claim 4, wherein the processing vessel is provided with a processing gas inlet means for supplying processing gases into the processing vessel.

7. The processing apparatus according to claim 4, wherein the processing vessel is provided with a emissivity measuring means for measuring an emissivity of the workpiece and giving the measured data to the radiation thermometer.

\* \* \* \* \*